(12) United States Patent
Moyal et al.

(10) Patent No.: US 6,208,193 B1
(45) Date of Patent: Mar. 27, 2001

(54) MULTIPLEXER CONTROL SCHEME

(75) Inventors: Nathan Y. Moyal; Brian G. Kirkland, both of Austin, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/232,344

(22) Filed: Jan. 15, 1999

(51) Int. Cl.[7] .................................................. H03K 17/62
(52) U.S. Cl. ............................................ 327/411; 327/407
(58) Field of Search .................................. 327/407–413

(56) References Cited

U.S. PATENT DOCUMENTS

| | | | |
|---|---|---|---|
| 4,572,967 | * | 2/1986 | Metz ..................................... 327/411 |
| 4,932,027 | * | 6/1990 | Scharrer ............................... 327/408 |
| 5,289,048 | * | 2/1994 | Ishhara et al. ....................... 327/407 |
| 5,352,987 | * | 10/1994 | Harvey ................................. 327/411 |
| 5,402,013 | * | 3/1995 | Friedrich .............................. 327/411 |

* cited by examiner

*Primary Examiner*—Toan Tran
(74) *Attorney, Agent, or Firm*—Christopher P. Maiorana, P.C.

(57) ABSTRACT

A circuit comprising a plurality of input devices, a plurality of de-select devices and a selector device. The plurality of input devices may each be configured to receive an input signal. The plurality of de-select devices may each be configured to present an output in response (i) one of the plurality of inputs and (ii) one of a plurality of de-select signals. The selector device may be configured to present the plurality of de-select signals. In general, all but one of the de-select signals is active at a time.

20 Claims, 3 Drawing Sheets

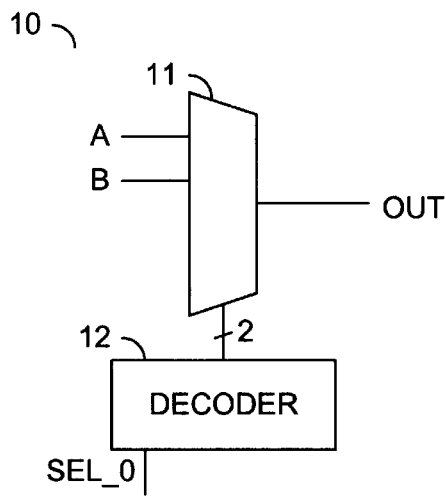
FIG. 1a
(CONVENTIONAL)
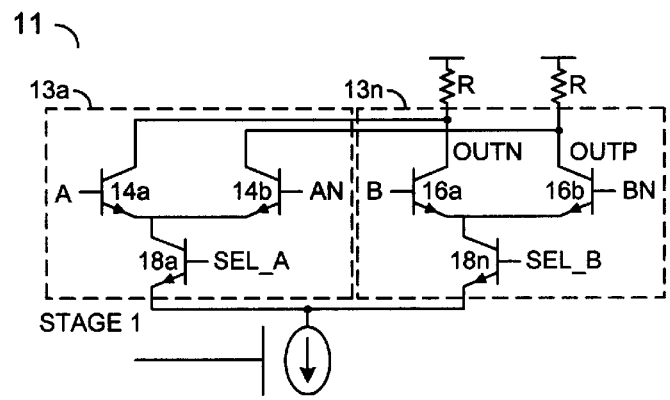
FIG. 1b
(CONVENTIONAL)
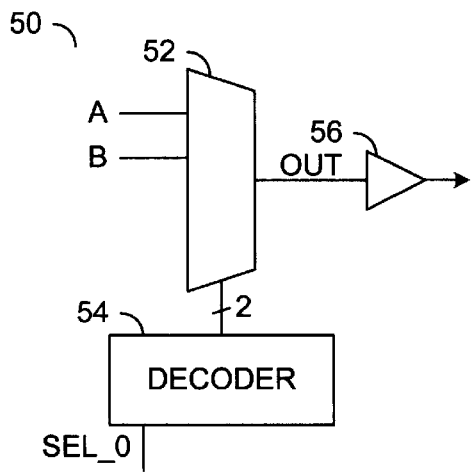
FIG. 2a
(CONVENTIONAL)
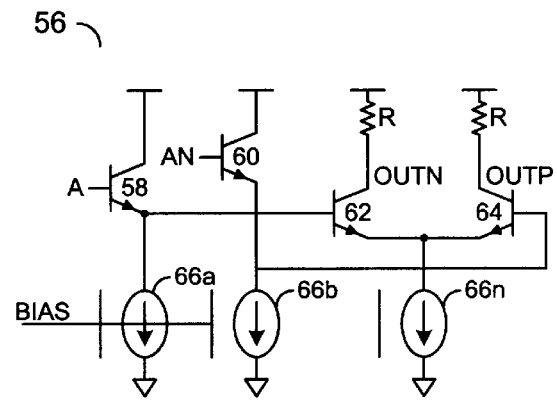
FIG. 2b
(CONVENTIONAL)

MULTIPLEXER CONTROL SCHEME

FIELD OF THE INVENTION

The present invention relates to multiplexers generally and, more particularly, to a circuit and a method for implementing a multi-input multiplexer using Current Mode Logic (CML) or other swing logic.

BACKGROUND OF THE INVENTION

FIG. 1a illustrates a circuit 10 illustrating a conventional approach to implementing a multiplexer. The circuit 10 comprises a multiplexer 11 and a decoder 12. The multiplexer 11 presents a first signal (i.e., a) or a second signal (i.e., b) in response to a control signal generated by the decoder 12. The decoder 12 may generate the control signal in response to the select signal (i.e., SEL0). FIG. 1b shows a more detailed diagram of the multiplexer 11. The multiplexer 11 comprises a number of stages 13a–13n. The stage 13a comprises a number of transistor pairs 14a–14b and the stage 13n comprises a number of transistor pairs 16a–16b. Each of the transistor pairs receives a differential input signal (e.g., A and An or B and Bn, respectively). A number of select transistors 18a–18n respond to a number of control signals (i.e., SEL_A and SEL_B) generated by the decoder 12. An example of the circuit 10 may be found in copending application, U.S. Ser. No. 09/182,556, filed on Oct. 19, 1998, entitled HIGH-SPEED, MULTIPLE-INPUT MULTIPLEXER SCHEME, which is hereby incorporated by reference in its entirety. The circuit 10 comprises N single ended select lines that are used for an N-input multiplexer. Only one select line is selected at a given time. This activates the selected stage 13a–13n while the non-selected stages are de-activated.

The circuit 10 is particularly useful for applications that have CML-type inputs and CML-type outputs. However, the circuit 10 may not be as useful where large output swings are required. For example, where the output swings higher than standard CML levels (e.g., 400 mV), the base collector may start leaking, and, in the extreme case, even forward bias. An additional limitation occurs when the input to the multiplexer 11 runs across two different power supplies. This means that potentially Vcb=Vswing+power supply drop (e.g., 0.4 v+0.2 v=0.6 v). Again, the base to collector junction could be forward biased.

Some of the disadvantages of the circuit 10 can be solved by adding an emitter follower on the input. However, such an approach generally requires three-level gating, which may not be practical for 3.3V supplies.

Referring to FIG. 2a, a circuit 50 is shown that can be used for instances where large output swings are required or an interface between two power supply zones is required. The circuit 50 generally comprises a multiplexer 52, a decoder 54 and a boost circuit 56. The multiplexer 52 is similar to the circuit 10. The boost circuit 56 may comprise a transistor 58, a transistor 60, a transistor 62, a transistor 64 and a number of current sources 66a–66n. A CML multiplexer can be used to do the functional selects followed by a swing boost circuit which contains an emitter follower (level shift) to keep the Vbc on the differential pair from forward biasing.

The circuit 50 has limitations associated with current, layout, stage distortion, noise induced distortion, matching, delay, and output swing variability. The additional circuitry generally increases the overall current use. The additional circuitry also generally increases the layout of the circuit 50 and increases distortion. Noise induced distortion can be caused if an additional buffer is far enough from the multiplexer 52. Power supply noise could be an issue it both buffers do not experience identical noise environment. This could result in noise induced distortion when matching two data paths (such as in an output buffer application where a pump up signal is matched to a pump down signal). The circuit 50 requires matching two buffers to two other buffers. The two stages will have a larger delay than desired. Output swing variability is difficult to achieve in the output level swing of the circuit 50 (or the circuit 10).

SUMMARY OF THE INVENTION

The present invention concerns a circuit comprising a plurality of input devices, a plurality of de-select devices and a selector device. The plurality of input devices may each be configured to receive an input signal. The plurality of de-select devices may each be configured to present an output in response (i) one of the plurality of inputs and (ii) one of a plurality of de-select signals. The selector device may be configured to present the plurality of de-select signals. In general, all but one of the de-select signals is active at a time.

The objects, features and advantages of the present invention include providing a multiplexer that may have reduced (i) current, (ii) layout, (iii) stage distortion, (iv) noise induced distortion, (v) matching delay, and (vi) output swing variability.

BRIEF DESCRIPTION OF THE DRAWINGS

These and other objects, features and advantages of the present invention will be apparent from the following detailed description and the appended claims and drawings in which:

FIGS. 1a and 1b illustrate a conventional approach to the implementing multiplexer;

FIGS. 2a and 2b and 2c illustrate an alternate conventional approach to implementing a multiplexer;

DETAILED DESCRIPTION OF THE PREFERRED EMBODIMENTS

Figure 3A:
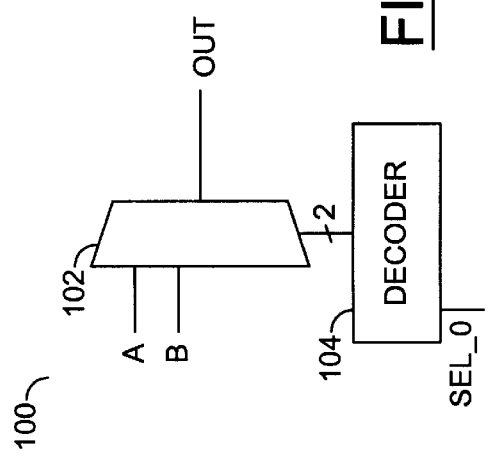
FIGS. 3a and 3b illustrate a preferred embodiment of the present invention.
Figure 3B:
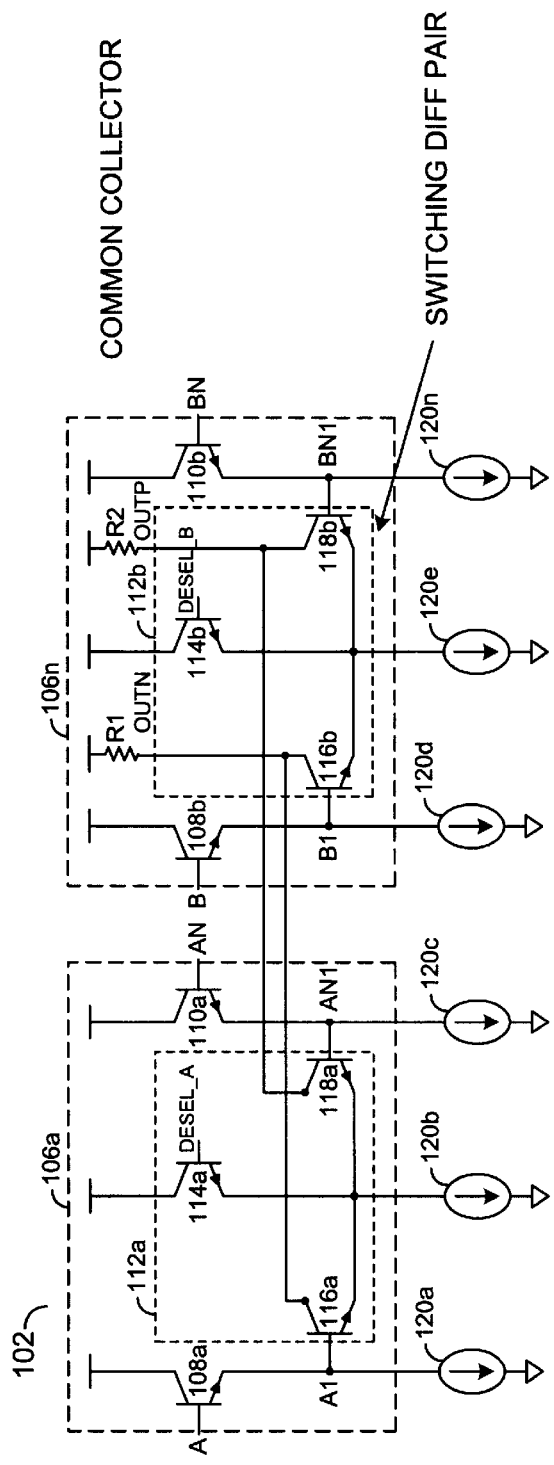

Referring to FIG. 3a, a circuit 100 is shown in accordance with a preferred embodiment of the present invention. The circuit 100 generally comprises a multiplexer 102 and a decoder 104. FIG. 3b illustrates a more detailed diagram of the multiplexer 102 that generally comprises a number of input devices 106a–106n. The input device 106a generally comprises a transistor 108a, a transistor 110a and a deselect circuit 112a. The deselect circuit 112a generally comprises a transistor 114a, a transistor 116a and a transistor 118a. The transistors 108a and 110a generally receive a differential data signal (e.g., A and An) at a first and a second gate. The source of the transistors 108a and 110a are generally connected to a supply voltage. The drains of the transistors 108a and 110a are generally connected to one of the current sources 120a–120n as well as to the deselect circuit 112a. In one example, the drain of the transistor 108a may be connected to the gate of the transistor 116a and the drain of the transistor 100a may be connected to the gate of the transistor 118a. The drains of the transistors 116a and 118a are generally connected, along with the drain of the transistor 114a, to the current source 120b.

The transistor 114a generally receives a control signal (e.g., DESEL_A) that generally enables the transistor 114a. As a result, the transistors 116a and 118a generally shutdown the select circuit 106a. The input device 106n generally has similar components as the input device 106a (e.g., 108b, 110b, 112b, 114b, 116b and 118b).

An output signal OUTN may be presented through a resistor R1 and an output signal OUTP may be presented through a resistor R2. The output signals OUTN and OUTP may be presented from the transistors 116a or 116b or the transistors 118a or 118b, respectively.

The functionality of the multiplexer 102 is generally accomplished by stirring the current on top of a particular differential pair (e.g., the transistors 116a and 118a) instead of shutting off the current source (e.g., 120a–120n) at the bottom as in some conventional approaches. Only one select line (e.g., desel_a, desel_b, etc.) is generally on at one time. By placing the current stir on top of the selected differential pair, enough head room may be present to level shift the inputs. The common collector structure may allow the sharing of the current path.

When the de-select signal (e.g., DESEL_A, DESEL_B, etc.) is high, current may be stirred away from the differential path, which may turn "off" the particular differential pair. An alternate implementation of the differential pair may be to connect one side at Vcc-Vbe and the other at Vcc. This allows a complete turn off of the non-selected differential pairs since the current travels to VCC through the select transistor.

When the de-select signal is low, the select transistor (e.g., 114a–114n) is completely off and does not generally draw any current. This allows the selected differential pair to function as an emitter shifted buffer.

The present invention may provide a multiplexer that may (i) be used where the output of the CML is greater than standard CML swing, (ii) be used across power supplies, (iii) have a fast multiplexer functionality (e.g., does not relay on pass gates to charge or discharge nodes) and (iv) require only two levels of gates.

Figure 4A:
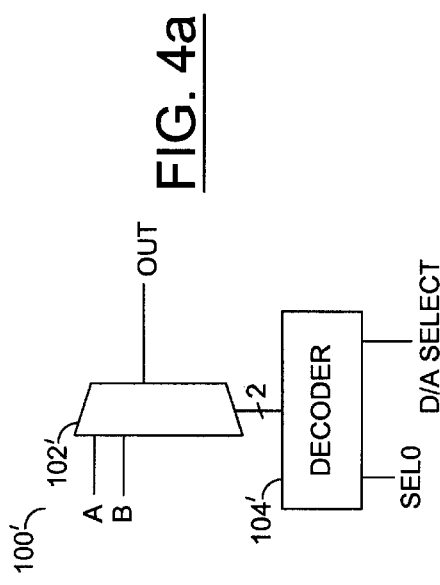
FIGS. 4a and 4b illustrate an alternate embodiment of the present invention.
Figure 4B:
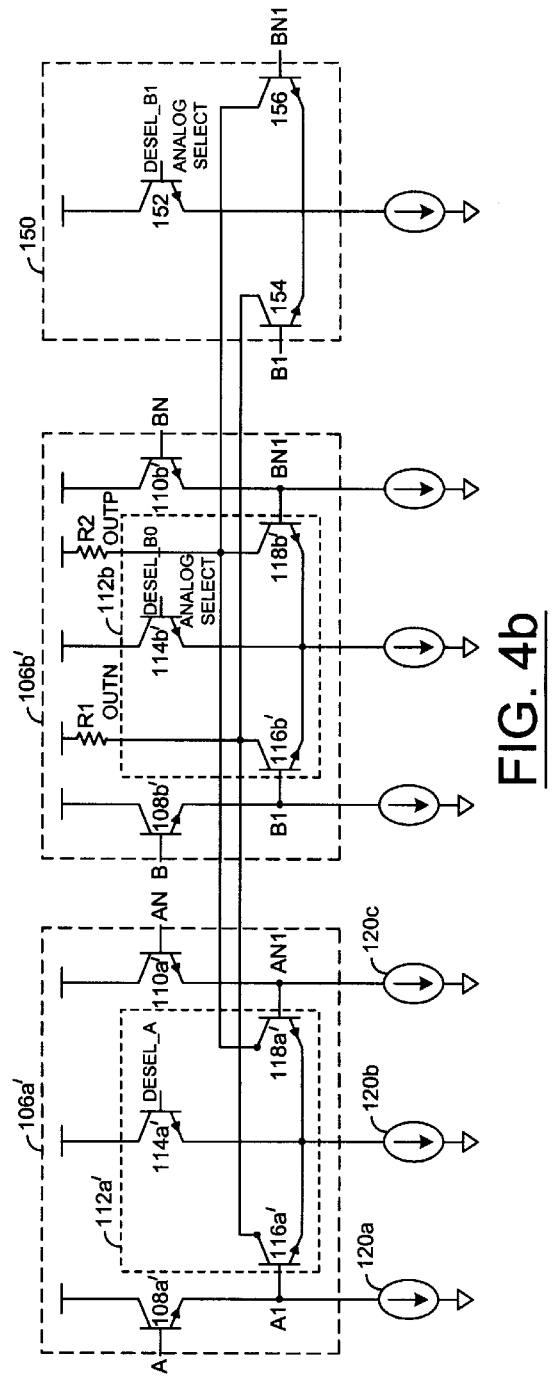

Referring to FIG. 4a, a circuit 100' is shown illustrating an alternate embodiment of the present invention. The circuit 100' comprises a multiplexer 102' and a decoder 104' that are similar to the multiplexer 102 and decoder 104 of the circuit 100 of FIG. 3a. The decoder has an additional input that receives a select signal (e.g., D/A SELECT) that may select between a digital and analog select signal presented to the multiplexer 102'.

An analog select circuit 150 may be connected to the input circuits 106a and 106b. The circuit 150 generally comprises a transistor 152, a transistor 154 and a transistor 156. The transistor 154 and the transistor 156 generally receive an input signal (e.g., B1 and BN1), respectively. The transistor 152 generally receives an analog de-select signal (e.g., DESEL_B1). The circuit 150 may be used to add digital-to-analog capabilities to the multiplexer 102'. Similar to the circuit 100, the circuit 100' may have additional parallel stages that may be connected to increase the overall functionality of a multiplexer.

The circuit 100' may (i) reduce current consumption, (ii) have a smaller layout, (iii) have less stage distortion, (iv) have less noise induced distortion, (v) have better matching, and (vi) have less delay.

The various components of the present invention may be modified to meet the design criteria of a particular implementation. For example, some or all of the NPN transistors may be implemented as NMOS or PMOS devices for operation with non-CML type logic. In another example, the resistor loads R1 and R2 may be implemented using active elements. Two or more branches may be selected (by de-selecting the current stir transistor) as long as the inputs are placed in parallel. This will increase the total current through the switching branch resulting in larger output swings. By selecting two or more branches, a swing select multiplexer digital to analog conversion may be implemented (e.g., a multiplexer which is capable of changing the output swing based on the select could be, but not necessary CMOS).

The present invention may be used to provide a multiplexer function, to provide a buffer across power supplies (e.g., a power supply buffer circuit) with increased output swing and/or to provide digital-to-analog conversion. One or more of the above functions may be combined which may result in a more efficient design. For example, a multiplexer with a buffering capability may be used in a wide range of applications.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
   a plurality of input devices each configured to receive an input signal, wherein each of said plurality of input devices comprises a differential transistor pair;
   a plurality of de-select devices each configured to present an output signal through at least one resistor in response to (i) one of said plurality of input signals and (ii) one of a plurality of de-select signals, wherein each of said de-select devices is connected to one or more of said input devices and one or more current sources; and
   a selector device configured to present said plurality of de-select signals, wherein all but one of said de-select signals is active at a time.

2. The circuit according to claim 1, wherein each of said inputs comprises a differential input.

3. The circuit according to claim 1, wherein said selector device comprises a decoder circuit configured to present said plurality of de-select signals in response to a plurality of input signals, wherein said plurality of input signals is less than said plurality of de-select signals.

4. The circuit according to claim 1, wherein each of said plurality of de-select devices comprises a transistor coupled to one of said plurality of differential pairs, wherein the gate or base of said transistor receives said one of said plurality of said select signals.

5. The circuit according to claim 4, wherein said de-select devices, said input devices and said selector device are fabricated using CMOS transistors.

6. The circuit according to claims 4, wherein said de-select devices, said input devices and said selector device are fabricated using bipolar transistors.

7. The circuit according to claim 4, wherein said plurality of input signals are CMOS level signals.

8. The circuit according to claim 4, wherein said plurality of input signals are CML-level signals.

9. The circuit according to claim 1, wherein said circuit is configured as a power supply buffer circuit.

10. The circuit according to claim 1, wherein all but one of said de-select signals is active to provide swing select analog-to-digital conversion between said input signals and said output signal.

11. A circuit comprising:
   a plurality of input devices each configured to receive an input signal;
   a plurality of de-select devices each configured to present an output signal through at least one resistor in response to (i) one of said plurality of inputs and (ii) one of a plurality of de-select signals, wherein each of said de-select devices (i) comprises a first transistor, a second transistor and a third transistor connected to a common node and (ii) is connected to one or more of said input devices; and
   a selector device configured to present said plurality of de-select signals.

12. The circuit according to claim 11, wherein said selector device comprises a decoder circuit configured to present said plurality of de-select signals in response to a plurality of input signals, wherein said plurality of input signals is less than said plurality of de-select signals.

13. The circuit according to claims 11, wherein said de-select devices, said input devices and said selector device are fabricated using CMOS transistors.

14. The circuit according to claims 11, wherein said de-select devices, said input devices and said selector device are fabricated using bipolar transistors.

15. The circuit according to claim 14, wherein said plurality of input signals are CMOS level signals.

16. The circuit according to claim 14, wherein said plurality of input signals are CML-level signals.

17. A method of generating an output in response to a plurality of inputs comprising the steps of:
   (a) receiving said plurality of input signals, wherein each of said plurality of input signals is received by a differential transistor pair;
   (b) generating a plurality of de-select signals, wherein all but one of said de-select signals is active at a time; and
   (c) generating said output in response (i) one of said plurality of inputs, (ii) one of said plurality of de-select signals and (iii) one or more current sources, wherein said output is presented through at least one resistor.

18. The method according to claim 17, wherein step (c) comprises a decoder circuit configured to present said plurality of select signals in response to a plurality of input signals, wherein said plurality of input signals is less than said plurality of select signals.

19. The method according to claim 17, wherein said method further comprises the step of:
   (d) providing swing select analog-to-digital conversion between said input signals and said output.

20. The method according to claim 17, wherein each of said de-select signals is received by one of a plurality of de-select devices comprising a first transistor, a second transistor and a third transistor connected to a common node.

* * * * *

UNITED STATES PATENT AND TRADEMARK OFFICE
CERTIFICATE OF CORRECTION

| | | |
|---|---|---|
| PATENT NO. | : 6,208,193 B1 | Page 1 of 1 |
| APPLICATION NO. | : 09/232344 | |
| DATED | : March 27, 2001 | |
| INVENTOR(S) | : Nathan Y. Moyal and Brian G. Kirkland | |

It is certified that error appears in the above-identified patent and that said Letters Patent is hereby corrected as shown below:

On Title Page, item (56) under 'References Cited', after 'U.S. PATENT DOCUMENTS' and before '*cited by examiner', please add --OTHER PUBLICATIONS U.S. Appl. No. 09/182,556: "High-Speed, Multiple-Input Multiplexer Scheme," Navabi et al.--

Signed and Sealed this

Ninth Day of August, 2011

David J. Kappos
*Director of the United States Patent and Trademark Office*